US012776779B2

(12) United States Patent
Dai et al.

(10) Patent No.: US 12,776,779 B2
(45) Date of Patent: Oct. 27, 2026

(54) IP FREQUENCY ADAPTIVE SAME-CYCLE CLOCK GATING

(71) Applicant: Intel Products IP LLC, Santa Clara, CA (US)

(72) Inventors: Jianwei Dai, Portland, OR (US); Jimin Zhang, Portland, OR (US)

(73) Assignee: Intel Products IP LLC, Santa Clara, CA (US)

( * ) Notice: Subject to any disclaimer, the term of this patent is extended or adjusted under 35 U.S.C. 154(b) by 0 days.

(21) Appl. No.: 18/089,026

(22) Filed: Dec. 27, 2022

(65) Prior Publication Data

US 2024/0213987 A1 Jun. 27, 2024

(51) Int. Cl.
*H03K 19/17736* (2020.01)
*H03K 19/17704* (2020.01)
*H03K 19/20* (2006.01)

(52) U.S. Cl.
CPC ... *H03K 19/1774* (2013.01); *H03K 19/17716* (2013.01); *H03K 19/20* (2013.01)

(58) Field of Classification Search
None
See application file for complete search history.

(56) References Cited

U.S. PATENT DOCUMENTS

2017/0019113 A1* 1/2017 Sekiguchi ................. H03L 3/00

* cited by examiner

*Primary Examiner* — Jany Richardson
(74) *Attorney, Agent, or Firm* — Schwegman Lundberg & Woessner, P.A.

(57) ABSTRACT

Adaptive clock gating may provide improved power management of electronic devices. Clock gating may include removing a clock signal to state elements when those state elements are not being used, and the adaptive clock gating may provide improved clock gating for higher-level clock gates operating at increased frequencies. In an example, the adaptive clock gating may enable clock gating for higher-level clock gates within IP blocks that may be otherwise prevented from using clock gating due to timing requirements. The adaptive clock gating may be used to reduce power consumed by the clock distribution of IP blocks, thereby providing improved power efficiency. An adaptive clock gating circuit may include an IP clock frequency control unit with an adaptive clock gating logic circuit. The adaptive clock gating logic circuit may be used to selectively enable or disable high-level clock gates for the target IP based on a selected clock frequency.

25 Claims, 7 Drawing Sheets

IP FREQUENCY ADAPTIVE SAME-CYCLE CLOCK GATING

TECHNICAL FIELD

Embodiments described herein generally relate to power management for electronic devices.

BACKGROUND

In modern system on a chip (SOC) design, clock gating may be used to reduce power consumed by state elements, such as flip-flops, latches, and other state elements. In operation, clock gating includes removing a clock signal to state elements when those state elements are not being used. By removing the clock signal, the state elements do not switch states, which reduces the power consumed by those state elements. However, clock gating may be impractical for electronic devices that have different delay times for different state elements, as not all state elements may be switched in a synchronized manner. What is needed is improved power reduction for state elements in electronic devices.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

In the following description, for purposes of explanation, numerous specific details are set forth to provide a thorough understanding of some example embodiments. It will be evident, however, to one skilled in the art that the present disclosure may be practiced without these specific details.

Figure 1:
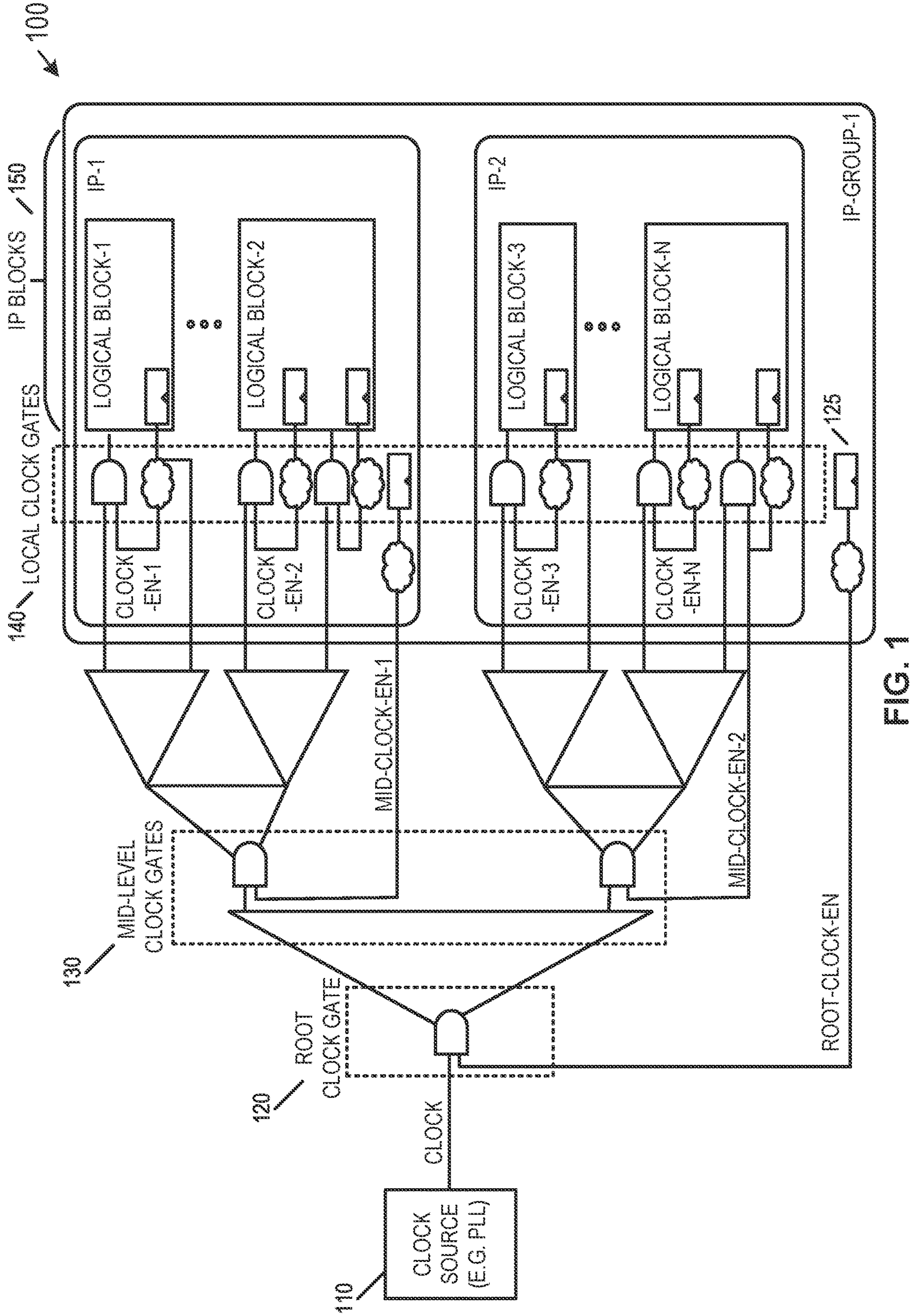
FIG. 1 is a block diagram illustrating an example multi-level clock gating architecture, according to an embodiment.

FIG. 1 is a block diagram illustrating an example multi-level clock gating architecture 100, according to an embodiment. Architecture 100 includes a clock source 110 that may be used to provide clock gating at multiple hierarchies. The clock source 110 may be used with a root clock gate 120 at a first level within the multi-level clock gating architecture 100. The multi-level clock gating architecture 100 may also include mid-level clock gates 130 and local clock gates 140.

Clock gating logic may be used to provide enable signals for each clock gate. Separate clock gating logic may be used within logical intellectual property (IP) blocks 150 and within various groupings of IP blocks 150. For example, the root clock gate 120 may receive a clock signal from clock source 110 and a root clock enable signal from clock gating logic 125. Each of the mid-level clock gates 130 and local clock gates 140 may also receive clock enable signals from respective clock gating logic at each IP level or within each IP group.

As shown in the multi-level clock gating architecture 100, local clock gates 140 are local (e.g., proximate) to state elements within IP blocks 150. The mid-level clock gates 130 and the mid-level clock gates 130 are separated from those state elements by more physical distance, so clock enable signals take longer to reach their respective clock gates. For lower frequency operation (e.g., at or below 1 GHz), timing delays caused by physical distance may have little or no effect on clock gate operation, and all clock gates may be enabled or disabled within the same clock cycle where their control signals are generated. However, as the clock frequency gets higher, local clock gates 140 can usually still take effect within the same cycle, whereas mid-level clock gates 130 and root clock gate 120 may take more than one clock cycle to react to the request.

The number of cycles needed to take effect may increase as the clock frequency increases, particularly for clock gates that are positioned farther away from the state elements generating the clock gating control signal. For systems that use many IP blocks 150 or increasingly larger IP blocks 150, more clock gates may take more than one clock cycle to disable or enable clocks after their respective control signals are generated. For various applications, taking more than one clock cycle to disable or enable clocks at higher-level gates may be an acceptable performance tradeoff. For example, taking additional time or clock cycles taken by a clock gate to enable or disable clocks results in increased power savings while also resulting in some performance reduction (e.g., increased signal delay).

To improve performance, multi-level clock gating architecture 100 may include a hysteresis scheme to avoid engaging those higher-level clock gating prematurely, which may be used to reduce or minimize any reduction in performance. Some systems may not be able to use a hysteresis scheme, such as for higher frequency systems and latency-sensitive systems. In an example, the performance of a computing architecture (e.g., SOC, computing fabric) may be improved when all clock gates (including higher-level clock gates) are re-enabled within the same cycle. In another example, re-enabling all clock gates within the same cycle may enable the full functionality of a computing architecture. For certain types of IPs for which performance is critical, these IPs may be expected to be able to operate at high clock frequencies, and clock gating (e.g., power saving) may be excluded for higher-level clock gates to ensure the expected or required performance levels. In some examples, by excluding higher-level clock gates from power-reducing clock gating, the SOC may continue to consume hundreds of milliwatts of power even when the state elements are idle.

To improve performance of SOC devices that operate at higher frequencies, the SOC design may employ dynamic voltage and frequency scaling (DVFS) techniques. The DVFS techniques may be used to improve power efficiency by reducing clock frequencies at run time when there is no need for high clock frequencies. In an example of DVFS operation, a CPU or other processor designed to operate at several GHz may spend a substantial portion (e.g., 80%) of its active time operating below 1 GHz. When a processor or architecture reduces its frequency through a DVFS technique, its supply voltage also decreases, which may provide substantial power savings (e.g., improved power efficiency).

To increase or maximize power savings, the supply voltage may be reduced to a target minimum level, where the target minimum level provides just enough power to meet timing requirements of the longest paths within the architecture. As shown in FIG. 1, the root clock gate 120 may be considered the longest path, which may be referred to as a critical path. Additional path types are shown and described with respect to FIG. 2.

Figure 2A:
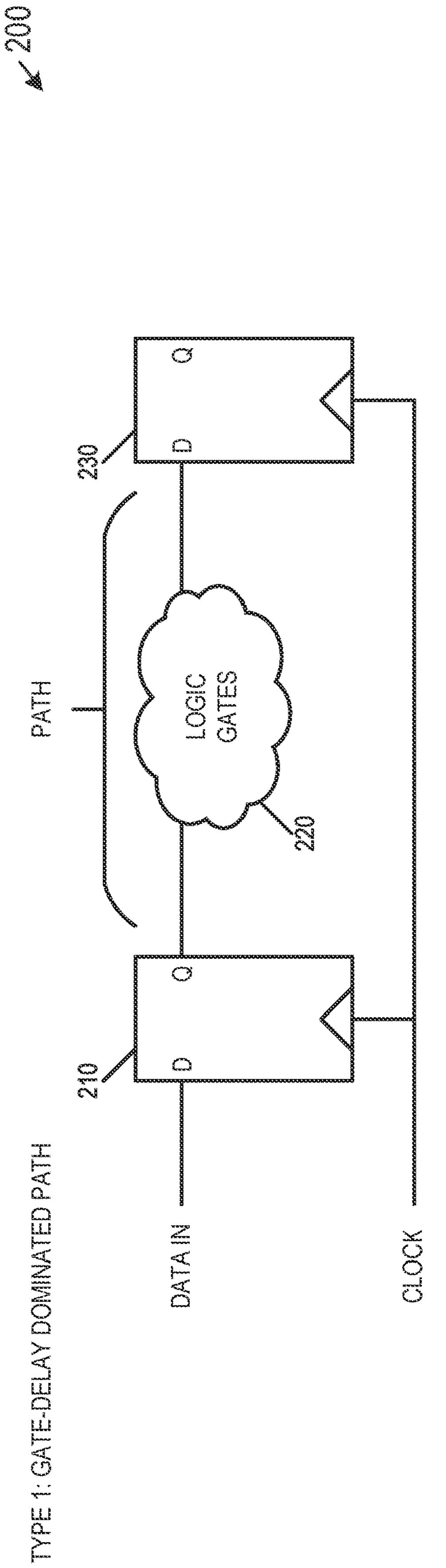
FIGS. 2A-2B are block diagrams illustrating delay paths, according to an embodiment.
Figure 2B:
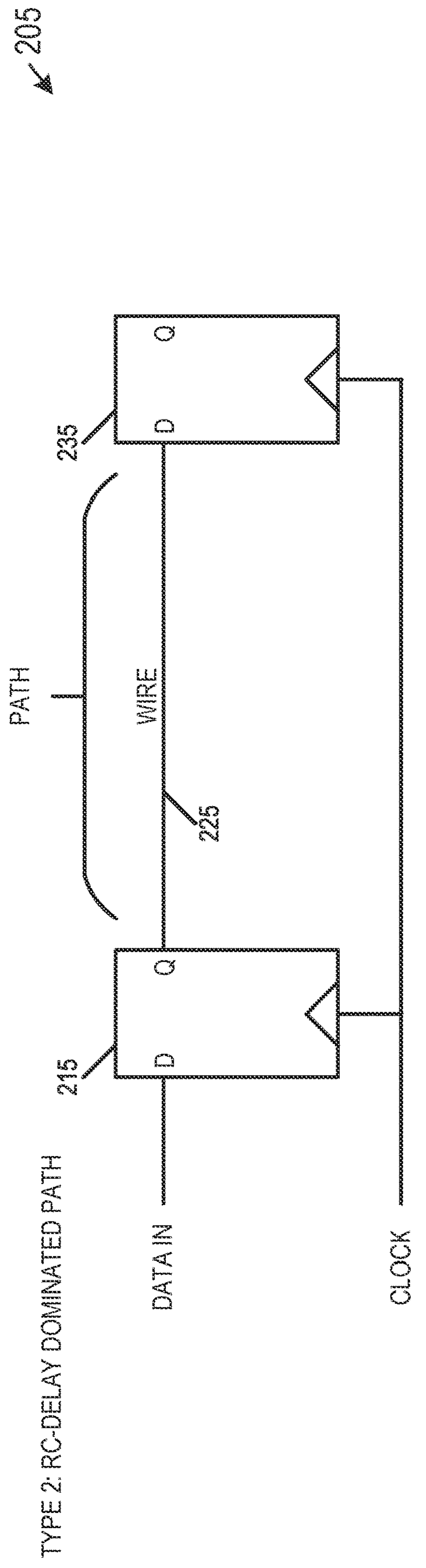

FIGS. 2A-2B are block diagrams illustrating delay paths, according to an embodiment. Reducing supply voltage (e.g., through DVFS or other voltage-reduction technique) may have different effects on distinct types of logic paths within a design. FIG. 2A shows a gate-delay dominated path 200 that includes an initial state element 210, a first logic path 220 including multiple logic gates, and a final state element 230. Because the first logic path 220 delay is dominated by logic gates, the overall delay may be more sensitive to voltage changes, and the overall delay may increase substantially as the voltage is reduced. FIG. 2B shows a RC-delay dominated path 205 that includes an initial state element 215, a second logic path 225 including various wire paths, and a final state element 235. Because the second logic path 225 is dominated by wire paths, its delay is much less sensitive to voltage changes, as wire transmission delay is substantially unaffected by voltage level.

Figure 3:
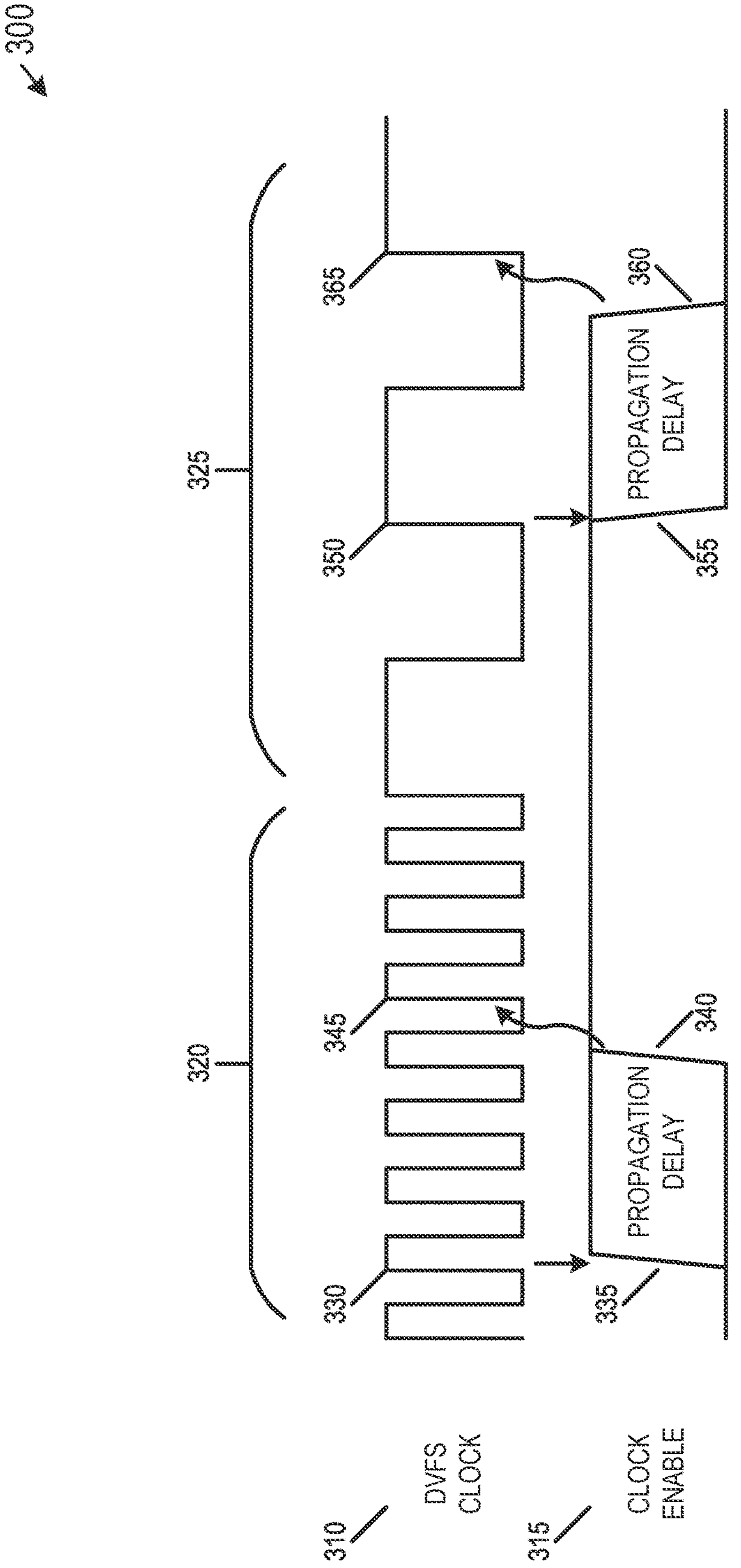
FIG. 3 is a block diagram illustrating an example clock-enable timing diagram, according to an embodiment.

FIG. 3 is a block diagram illustrating an example clock-enable timing diagram 300, according to an embodiment. The clock-enable timing diagram 300 shows a DVFS clock 310 and a clock enable signal 315. The DVFS clock 310 includes a higher frequency portion 320 and a lower frequency portion 325. The DVFS clock 310 may transition from the higher frequency portion 320 to the lower frequency portion 325 in response to a reduction in voltage as part of the DVFS power reduction.

At a first clock cycle 330 within the higher frequency portion 320, the clock enable signal may transition from a logical OFF value (e.g., a voltage level corresponding to a logical low voltage value) to a logical ON value (e.g., a voltage level corresponding to a logical high voltage value) at a first clock enable time 335. For longer delay path (e.g., RC-delay dominated path 205), there may be a propagation delay between the first clock enable time 335 and a second clock enable time 340 where the clock enable signal is received at the end of the delay path. During the propagation delay, multiple cycles of the DVFS clock 310 may occur between the first clock cycle 330 and a propagation delay clock cycle 345.

At a third clock cycle 350 within the lower frequency portion 325, the clock enable signal may transition from the logical ON value to a logical OFF value at a third clock enable time 355. Even for longer delay path, the propagation delay between the third clock enable time 355 and a fourth clock enable time 360 may occur within a single clock cycle, such as between the third clock cycle 350 and the fourth clock cycle 365. When the DVFS clock 310 is running at lower frequencies with lower voltage, there is more timing margin available for high-level clock gates to receive their control signals and take corresponding actions.

Figure 4:
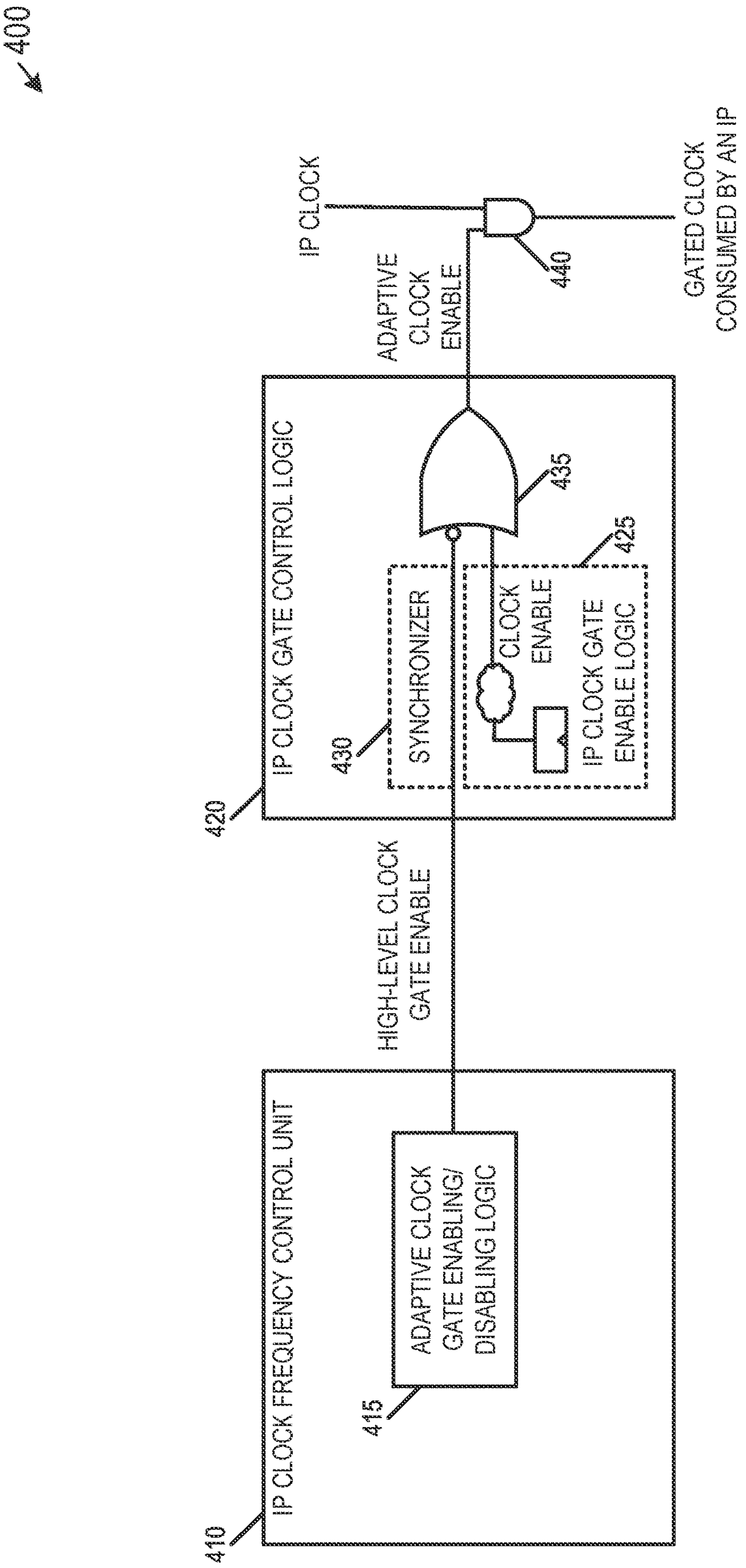
FIG. 4 is a block diagram illustrating an example adaptive clock gating, according to an embodiment.

FIG. 4 is a block diagram illustrating an example adaptive clock gating 400, according to an embodiment. The adaptive clock gating 400 may provide improved clock gating for higher-level clock gates operating at increased frequencies. In an example, the adaptive clock gating 400 may enable clock gating for higher-level clock gates within IP blocks that may be otherwise prevented from using clock gating due to timing requirements. The adaptive clock gating 400 may be used to reduce power consumed by the clock distribution of IP blocks, thereby providing improved power efficiency.

The adaptive clock gating 400 includes an IP clock frequency control unit 410, which includes adaptive clock gating enabling/disabling logic 415. The disabling logic 415 provides logic that works with the IP clock frequency control unit 410 to selectively enable or disable high-level clock gates for the target IP based on the selected clock frequency of the IP block at runtime (e.g., during execution of program code). To enable or disable high-level clock gates, the disabling logic 415 generates a high-level clock gate enable signal, which may be set to a logical ON value or a logical OFF value.

The adaptive clock gating 400 also includes IP clock gate control logic 420. The IP clock gate control logic 420 includes IP clock gate enable logic 425, where IP clock gate enable logic 425 may be used to monitor whether an IP block needs the clock, and to generate a clock enable signal accordingly. In an example, the IP clock gate enable logic 425 may set the clock enable signal to a logical ON value when the IP block needs the clock, and set the clock enable signal to a logical OFF value when the IP block does not the clock.

The IP clock gate control logic 420 may include an OR logic gate 435 to combine the clock enable signal with a high-level clock gate enable signal generated by the disabling logic 415. The OR logic gate 435 may include an inverter to invert the high-level clock gate enable signal. In an example, the logic gate 435 may receive the inverted high-level clock gate enable signal and the clock enable signal, and generate a logical ON value when either input signals are set to a logical ON value. An example of the operation of the logic gate 435 can be seen in FIG. 5, where the output adaptive clock enable signal 540 is set to a logical ON value (e.g., high) when either the inverted and delayed high-level clock gate enable signal 520 or the IP clock enable signal 530 is set to a logical ON value. The IP clock gate control logic 420 may include a clock enable signal synchronizer 430, which may be used to synchronize the high-level clock gate enable signal with the timing used by the IP clock gate control logic 420.

The OR logic gate 435 may combine the clock enable signal with the high-level clock gate enable signal to generate an adaptive clock enable signal. This adaptive clock enable signal may be combined with an IP clock signal at an AND logic gate 440 to generate a gated clock signal, where the gated clock signal may be consumed by the IP block. In an example, the output of the logic gate 440 matches the IP clock signal when the adaptive clock enable signal is set to a logical ON value, and is otherwise set to a logical OFF value (e.g., provides no clock signal).

The gated clock signal provided by adaptive clock gating 400 may be used to provide various power efficiency improvements. IP blocks may be expected to operate at reduced frequencies periodically to improve power efficiency. In some examples, such as during video playback or video conferencing, many IP blocks may be instructed to operate at lowest available frequencies. The gated clock signal provided by adaptive clock gating 400 provides the ability to enable clock gating for higher-level clock gates. This provides improved power efficiency, such as by substantially reducing the power consumed by the clock distribution of those IP blocks. The gated clock signal provided by adaptive clock gating 400 also provides improved performance over solutions that implement a hysteresis timer implemented to avoid unnecessary performance penalties assuming high-level clock gates, such as by eliminating the hysteresis timers while operating at lower frequencies without adding any performance penalty.

The gated clock signal provided by adaptive clock gating 400 provides advantages over solutions that excludes higher-level clocks from clock gating, which does not provide reductions in power consumption. This also provides advantages over approaches that separates logic components into groups with smaller physical sizes. This logic components separation may not be able to be implemented in certain IP blocks, including IP blocks that cannot be broken up into multiple partitions, such as due to IP complexity or due to being an external third-party IP block that does not provide access to subcomponents. The logic components separation may also remain limited by a maximum clock frequency, such as computing domain clocking, where an SOC may still not be able to meet timing requirements for higher-level clock gating. Additionally, separating logic components is not possible in all configurations, such as when there are physical floorplan constrains due to highest clock frequency convergence requirements.

Figure 5:
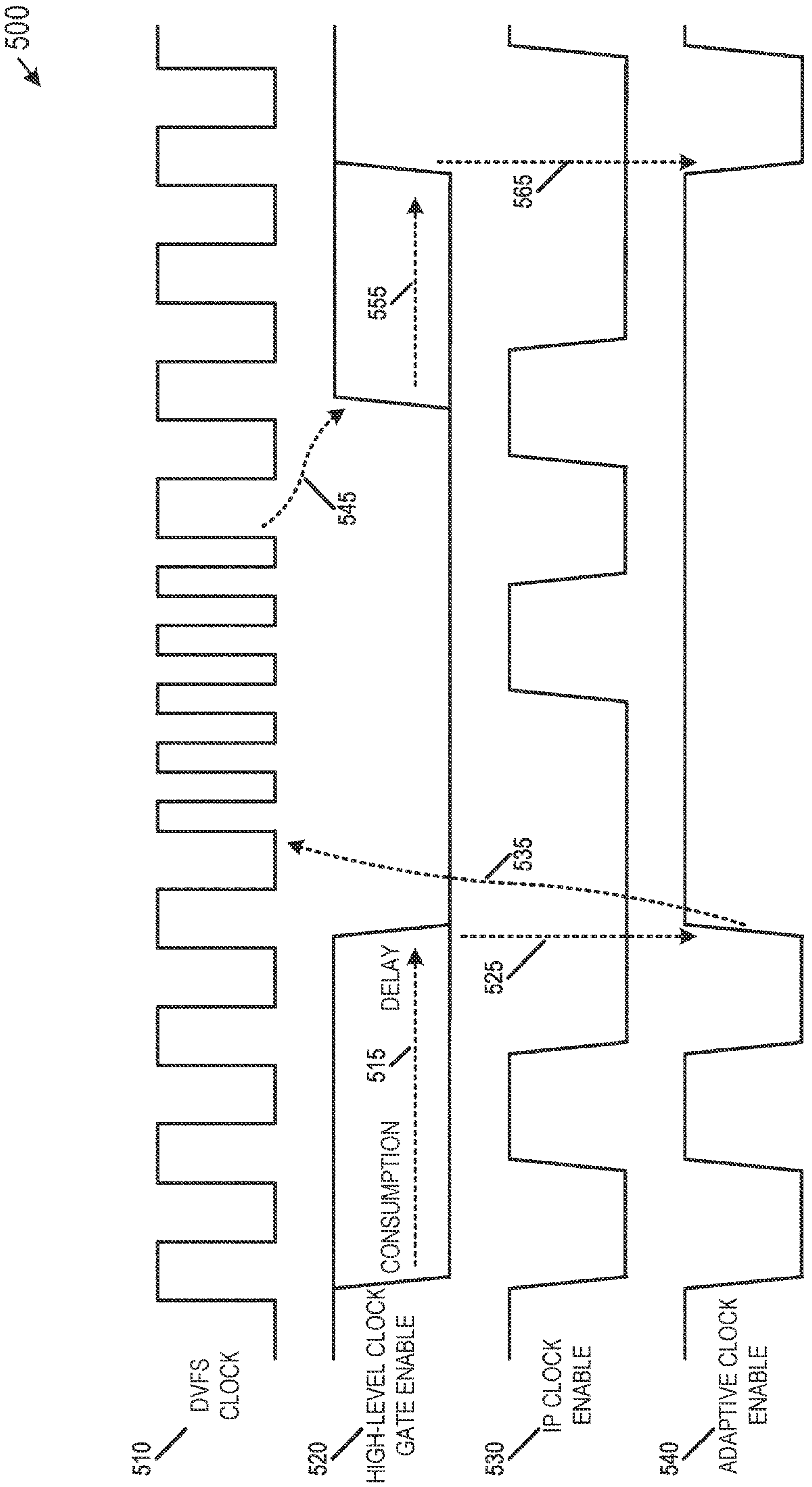
FIG. 5 is a block diagram illustrating an example adaptive clock-enable timing diagram, according to an embodiment.

FIG. 5 is a block diagram illustrating an example adaptive clock-enable timing diagram 500, according to an embodiment. The adaptive clock-enable timing diagram 500 shows signals generated by various IP components, such as adaptive clock gating 400 components shown in FIG. 4. The adaptive clock-enable timing diagram 500 shows a DVFS clock 510, a high-level clock gate enable signal 520, an IP clock enable signal 530, and an adaptive clock enable signal 540.

During a lower frequency portion of the DVFS clock 510, the high-level clock gate enable signal 520 may transition from a logical ON value to a logical OFF value. There may be a first transition delay 515 between the generation of the logical OFF value and the receipt 525 of the logical OFF value at higher-level gates, where the first transition delay 515 may be selected to provide enough time (e.g., an sufficient number of cycles of the IP clock enable signal 530) for the high-level clock gate enable signal 520 to be consumed by the higher-level clock gates. Upon receipt 525 of the high-level clock gate enable signal 520, the IP clock enable signal 530 may remain at a logical OFF value, and the adaptive clock enable signal 540 may remain at a logical ON value.

The DVFS clock 510 may undergo a first frequency transition 535 from a lower clock frequency to a higher clock frequency, such as when full processing capability is demanded of all IP blocks. After a period of full processing capability, the DVFS clock 510 may undergo a second frequency transition 545 from the higher clock frequency to the lower clock frequency. In response, the high-level clock gate enable signal 520 may transition to a logical high state to enable high-level clock gates. There may be a second transition delay 555 between the generation of the logical ON value and the receipt 565 of the logical ON value at higher-level gates, where the second transition delay 555 may be selected to provide enough time (e.g., an sufficient number of cycles of the IP clock enable signal 530) for the high-level clock gate enable signal 520 to be consumed by the higher-level clock gates. Upon receipt 565 of the high-level clock gate enable signal 520, the IP clock enable signal 530 may remain at a logical OFF value, and the adaptive clock enable signal 540 may remain at a logical OFF value.

This operation of the adaptive clock enable signal 540 shown in adaptive clock-enable timing diagram 500 enables clock gating for higher-level clock gates, where the higher-level clock gates may not otherwise be able to use clock gating due to timing requirements. This provides selective enabling and disabling high-level clock gates for those IP blocks when their clock frequency is low while keeping those gates disabled while they are running at higher clock frequencies. The operation shown in adaptive clock-enable timing diagram 500 provides a reduction in power consumed by the clock distribution of those IP blocks, which provides improved power efficiency throughout operation.

Figure 6:
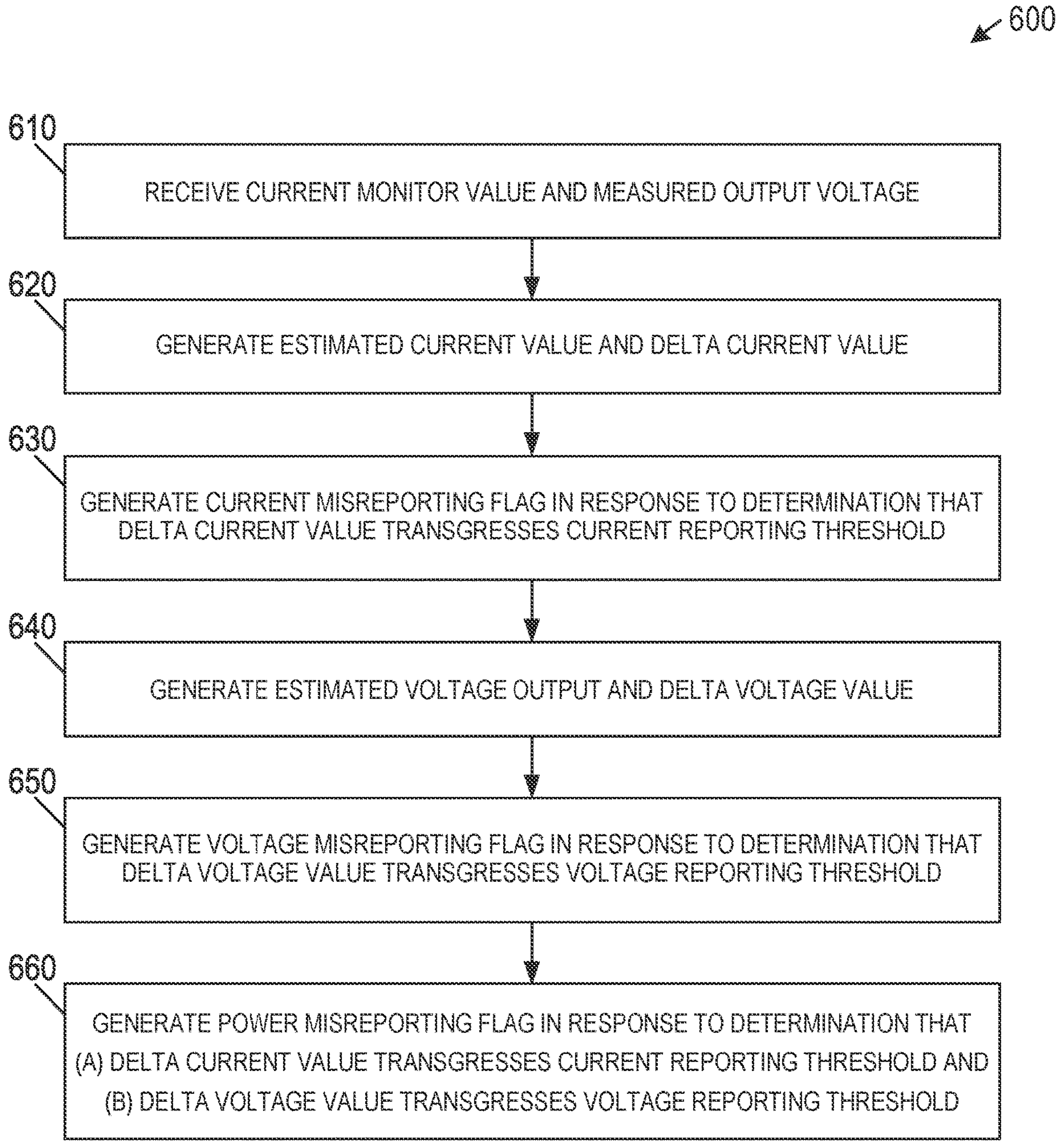
FIG. 6 is a flowchart illustrating a method for frequency-adaptive clock gating, according to an embodiment.

FIG. 6 is a flowchart illustrating a method for frequency-adaptive clock gating 600, according to an embodiment. Method 600 includes generating 610 a high-level clock gate enable signal at an adaptive clock gate enable circuit. Method 600 includes generating 620 an IP clock enable signal at an IP clock gate control logic circuit. Method 600 includes generating 630, at a control logic gate circuit within the IP clock gate control logic circuit, an adaptive clock enable signal based on the high-level clock gate enable signal and the IP clock enable signal. Method 600 includes generating 640 a gated clock signal at an IP logic gate circuit based on the adaptive clock enable signal and an IP clock. The gated clock signal to be received by an IP circuit to selectively disable flip-flops within the IP circuit. The gated clock signal received by the IP circuit may cause a power consumption reduction by the IP circuit.

The IP clock gate control logic circuit may include an IP clock gate enable logic circuit. The IP clock gate enable logic circuit may be used to generate the IP clock enable signal. The IP clock gate enable logic circuit may be used to generate the IP clock enable signal based on a binary IP local clock state, where the binary IP local clock state indicates whether an IP block needs the clock signal. In an example, IP clock gate sets the IP clock enable signal to a logical ON state when both the binary IP local clock state and the adaptive clock enable signal are set to a logical ON state.

The control logic gate circuit may include an OR logic gate. The OR logic gate may be used to receive the high-level clock gate enable signal, generate an inverted high-level enable signal based on the high-level clock gate enable signal, receive the IP clock enable signal, and generate the adaptive clock enable signal. The adaptive clock enable signal including an adaptive clock logical ON value when either the inverted high-level enable signal or the IP clock enable signal may include an IP logical ON signal level.

The IP logic gate circuit may include an AND logic gate. The AND logic gate may be used to receive the adaptive clock enable signal and the IP clock and generate the gated clock signal. The gated clock signal including a gated clock logical ON value when both the adaptive clock enable signal and the IP clock include a gated clock logical ON signal level.

The adaptive clock gate enable circuit may be within an IP clock frequency control unit circuit. The adaptive clock gate enable circuit may be used to generate the high-level clock gate enable signal based on an IP variable clock frequency value. Method 600 may further include determining 650, at the IP clock frequency control unit circuit, the IP variable clock frequency value transgresses a clock frequency threshold. The adaptive clock gate enable circuit may be used to generate the high-level clock gate enable signal in response to the IP variable clock frequency value transgressing the clock frequency threshold.

Figure 7:
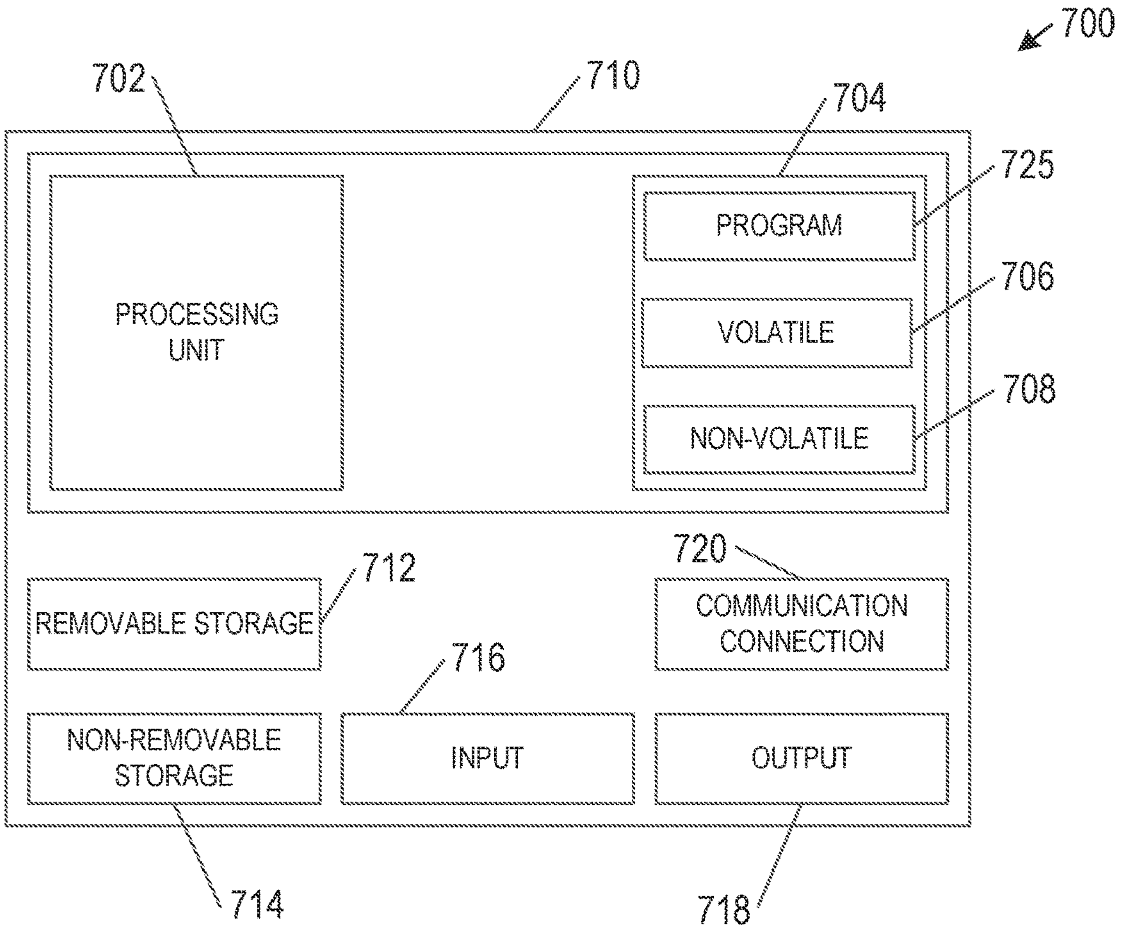
FIG. 7 is a block diagram of a computing device employing adaptive clock gating, according to an embodiment.

FIG. 7 is a block diagram of a computing device 700 employing adaptive clock gating, according to an embodiment. The performance of one or more components within computing device 700 may be improved by including one or more of the circuits or circuitry methods described herein. Computing device 700 may include an adaptive clock gate enable circuit to generate a high-level clock gate enable signal, an IP clock gate control logic circuit to generate an IP clock enable signal, a control logic gate circuit within the IP clock gate control logic circuit, the control logic gate circuit to generate an adaptive clock enable signal based on the high-level clock gate enable signal and the IP clock enable signal, and an IP logic gate circuit to generate a gated clock signal based on the adaptive clock enable signal and an IP clock signal, the gated clock signal to be received by an IP circuit to selectively disable flip-flops within the IP circuit.

In one embodiment, multiple such computer systems are used in a distributed network to implement multiple components in a transaction-based environment. An object-oriented, service-oriented, or other architecture may be used to implement such functions and communicate between the multiple systems and components. In some embodiments, the computing device of FIG. 7 is an example of a client device that may invoke methods described herein over a network. In some embodiments, the computing device of FIG. 7 is an example of one or more of the personal computer, smartphone, tablet, or various servers.

One example computing device in the form of a computer 710, may include a processing unit 702, memory 704, removable storage 712, and non-removable storage 714. Although the example computing device is illustrated and described as computer 710, the computing device may be in different forms in different embodiments. For example, the computing device may instead be a smartphone, a tablet, or other computing device including the same or similar elements as illustrated and described with regard to FIG. 7. Further, although the various data storage elements are illustrated as part of the computer 710, the storage may include cloud-based storage accessible via a network, such as the Internet.

Returning to the computer 710, memory 704 may include volatile memory 706 and non-volatile memory 708. Computer 710 may include or have access to a computing environment that includes a variety of computer-readable media, such as volatile memory 706 and non-volatile memory 708, removable storage 712 and non-removable storage 714. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 710 may include or have access to a computing environment that includes input 716, output 718, and a communication connection 720. The input 716 may include one or more of a touchscreen, touchpad, mouse, keyboard, camera, and other input devices. The input 716 may include a navigation sensor input, such as a GNSS receiver, a SOP receiver, an inertial sensor (e.g., accelerometers, gyroscopes), a local ranging sensor (e.g., LIDAR), an optical sensor (e.g., cameras), or other sensors. The computer may operate in a networked environment using a communication connection 720 to connect to one or more remote computers, such as database servers, web servers, and another computing device. An example remote computer may include a personal computer (PC), server, router, network PC, a peer device or other common network node, or the like. The communication connection 720 may be a network interface device such as one or both of an Ethernet card and a wireless card or circuit that may be connected to a network. The network may include one or more of a Local Area Network (LAN), a Wide Area Network (WAN), the Internet, and other networks.

Computer-readable instructions stored on a computer-readable medium are executable by the processing unit 702 of the computer 710. A hard drive (magnetic disk or solid state), CD-ROM, and RAM are some examples of articles including a non-transitory computer-readable medium. For example, various computer programs 725 or apps, such as one or more applications and modules implementing one or more of the methods illustrated and described herein or an app or application that executes on a mobile device or is accessible via a web browser, may be stored on a non-transitory computer-readable medium.

Embodiments may be implemented in one or a combination of hardware, firmware, and software. Embodiments may also be implemented as instructions stored on a machine-readable storage device, which may be read and executed by at least one processor to perform the operations described herein. A machine-readable storage device may include any non-transitory mechanism for storing information in a form readable by a machine (e.g., a computer). For example, a machine-readable storage device may include read-only memory (ROM), random-access memory (RAM), magnetic disk storage media, optical storage media, flash-memory devices, and other storage devices and media.

A processor subsystem may be used to execute the instruction on the machine-readable medium. The processor subsystem may include one or more processors, each with one or more cores. Additionally, the processor subsystem may be disposed on one or more physical devices. The processor subsystem may include one or more specialized processors, such as a graphics processing unit (GPU), a digital signal processor (DSP), a field programmable gate array (FPGA), or a fixed function processor.

Examples, as described herein, may include, or may operate on, logic or a number of components, modules, or mechanisms. Modules may be hardware, software, or firmware communicatively coupled to one or more processors in order to carry out the operations described herein. Modules may be hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

Each of the following non-limiting examples may stand on its own, or may be combined in various permutations or combinations with one or more of the other examples.

Example 1 is a system comprising: an adaptive clock gate enable circuit to generate a clock gate enable signal; a clock gate control logic circuit to generate a clock enable signal; a control logic gate circuit within the clock gate control logic circuit, the control logic gate circuit to generate an adaptive clock enable signal based on the clock gate enable signal and the clock enable signal; and a logic gate circuit to generate a gated clock signal based on the adaptive clock enable signal and a clock signal, the gated clock signal to be received by an intellectual property (IP) circuit to selectively disable flip-flops within the IP circuit.

In Example 2, the subject matter of Example 1 includes further subject matter where the gated clock signal received by the IP circuit causes a power consumption reduction by the IP circuit.

In Example 3, the subject matter of Examples 1-2 includes a clock gate enable logic circuit within the clock gate control logic circuit, wherein the clock gate enable logic circuit is to generate the clock enable signal.

In Example 4, the subject matter of Example 3 includes further subject matter where the clock gate enable logic circuit is to generate the clock enable signal based on a binary local clock state.

In Example 5, the subject matter of Examples 1-4 includes further subject matter where the control logic gate circuit includes an OR logic gate to: receive the clock gate enable signal; generate an inverted enable signal based on the clock gate enable signal; receive the clock enable signal; and generate the adaptive clock enable signal, the adaptive clock enable signal including an adaptive clock logical ON value when either the inverted enable signal or the clock enable signal includes an IP logical high signal level.

In Example 6, the subject matter of Examples 1-5 includes further subject matter where the logic gate circuit includes an AND logic gate to: receive the adaptive clock enable signal and the clock signal; and generate the gated clock signal, the gated clock signal including a gated clock logical ON value when both the adaptive clock enable signal and the clock signal include a gated clock logical high signal level.

In Example 7, the subject matter of Examples 1-6 includes a clock frequency control unit circuit, the adaptive clock gate enable circuit within the clock frequency control unit circuit; wherein the adaptive clock gate enable circuit is to generate the clock gate enable signal based on an IP variable clock frequency value.

In Example 8, the subject matter of Example 7 includes further subject matter where: the clock frequency control unit circuit is configured to determine the IP variable clock frequency value transgresses a clock frequency threshold; and the adaptive clock gate enable circuit is to generate the clock gate enable signal in response to the IP variable clock frequency value transgressing the clock frequency threshold.

In Example 9, the subject matter of Examples 7-8 includes a clock gate synchronizer within the clock gate control logic circuit, the clock gate synchronizer to synchronize the clock gate enable signal with the clock signal.

Example 10 is a method comprising: generating a clock gate enable signal at an adaptive clock gate enable circuit; generating a clock enable signal at a clock gate control logic circuit; generating, at a control logic gate circuit within the clock gate control logic circuit, an adaptive clock enable signal based on the clock gate enable signal and the clock enable signal; and generating a gated clock signal at an IP logic gate circuit based on the adaptive clock enable signal and a clock signal, the gated clock signal to be received by an intellectual property (IP) circuit to selectively disable flip-flops within the IP circuit.

In Example 11, the subject matter of Example 10 includes further subject matter where the gated clock signal received by the IP circuit causes a power consumption reduction by the IP circuit.

In Example 12, the subject matter of Examples 10-11 includes further subject matter where: the clock gate control logic circuit includes a clock gate enable logic circuit; and the clock gate enable logic circuit is to generate the clock enable signal.

In Example 13, the subject matter of Example 12 includes further subject matter where the clock gate enable logic circuit is to generate the clock enable signal based on a binary local clock state.

In Example 14, the subject matter of Examples 10-13 includes further subject matter where the control logic gate circuit includes an OR logic gate to: receive the clock gate enable signal; generate an inverted enable signal based on the clock gate enable signal; receive the clock enable signal; and generate the adaptive clock enable signal, the adaptive clock enable signal including an adaptive clock logical ON value when either the inverted enable signal or the clock enable signal includes an IP logical high signal level.

In Example 15, the subject matter of Examples 10-14 includes further subject matter where the logic gate circuit includes an AND logic gate to: receive the adaptive clock enable signal and the clock signal; and generate the gated clock signal, the gated clock signal including a gated clock logical ON value when both the adaptive clock enable signal and the clock signal include a gated clock logical high signal level.

In Example 16, the subject matter of Examples 10-15 includes further subject matter where: the adaptive clock gate enable circuit is within a clock frequency control unit circuit; and the adaptive clock gate enable circuit is to generate the clock gate enable signal based on an IP variable clock frequency value.

In Example 17, the subject matter of Example 16 includes determining, at the clock frequency control unit circuit, the IP variable clock frequency value transgresses a clock frequency threshold; wherein the adaptive clock gate enable circuit is to generate the clock gate enable signal in response to the IP variable clock frequency value transgressing the clock frequency threshold.

In Example 18, the subject matter of Examples 16-17 includes synchronizing, at a clock gate synchronizer within the clock gate control logic circuit, the clock gate enable signal with the clock signal.

Example 19 is a system comprising: a clock frequency control unit circuit to generate a clock gate enable signal based on an IP variable clock frequency value; a clock gate control logic circuit coupled to the clock frequency control unit circuit, the clock gate control logic circuit to generate an adaptive clock enable signal based on the clock gate enable signal, and an IP logic gate circuit coupled to the clock gate control logic circuit, the logic gate circuit to generate a gated clock signal based on the adaptive clock enable signal, the gated clock signal to be received by an intellectual property (IP) circuit to selectively disable flip-flops within the IP circuit.

In Example 20, the subject matter of Example 19 includes an adaptive clock gate enable circuit within the clock frequency control unit circuit, the adaptive clock gate enable circuit to generate the clock gate enable signal; a clock gate control logic circuit within the clock gate control logic circuit, the clock gate control logic circuit to generate a clock enable signal; a control logic gate circuit within the clock gate control logic circuit, the control logic gate circuit to generate an adaptive clock enable signal based on the clock gate enable signal and the clock enable signal; and an IP logic gate circuit to generate the gated clock signal based on the adaptive clock enable signal and a clock signal.

In Example 21, the subject matter of Example 20 includes further subject matter where the gated clock signal received by the IP circuit causes a power consumption reduction by the IP circuit.

In Example 22, the subject matter of Examples 20-21 includes a clock gate enable logic circuit within the clock gate control logic circuit, wherein the clock gate enable logic circuit is to generate the clock enable signal.

In Example 23, the subject matter of Example 22 includes further subject matter where the clock gate enable logic circuit is to generate the clock enable signal based on a binary local clock state.

In Example 24, the subject matter of Examples 20-23 includes further subject matter where the control logic gate circuit includes an OR logic gate to: receive the clock gate enable signal; generate an inverted enable signal based on the clock gate enable signal; receive the clock enable signal; and generate the adaptive clock enable signal, the adaptive clock enable signal including an adaptive clock logical ON value when either the inverted enable signal or the clock enable signal includes an IP logical high signal level.

In Example 25, the subject matter of Examples 20-24 includes further subject matter where the logic gate circuit includes an AND logic gate to: receive the adaptive clock enable signal and the clock signal; and generate the gated clock signal, the gated clock signal including a gated clock logical ON value when both the adaptive clock enable signal and the clock signal include a gated clock logical high signal level.

Example 26 is at least one machine-readable medium including instructions that, when executed by processing circuitry, cause the processing circuitry to perform operations to implement of any of method Examples 10-18.

Example 27 is an apparatus comprising means to implement of any of method Examples 10-18.

Example 28 is a system to implement of any of method Examples 10-18.

Circuitry or circuits, as used in this document, may comprise, for example, singly or in any combination, hardwired circuitry, programmable circuitry such as computer processors comprising one or more individual instruction processing cores, state machine circuitry, and/or firmware that stores instructions executed by programmable circuitry. The circuits, circuitry, or modules may, collectively or individually, be embodied as circuitry that forms part of a larger system, for example, an integrated circuit (IC), system on-chip (SoC), desktop computers, laptop computers, tablet computers, servers, smart phones, etc.

As used in any embodiment herein, the term "logic" may refer to firmware and/or circuitry configured to perform any of the aforementioned operations. Firmware may be embodied as code, instructions or instruction sets and/or data that are hard-coded (e.g., nonvolatile) in memory devices and/or circuitry.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, by the processor circuitry executing code and/or instructions sets (e.g., software, firmware, etc.) corresponding to the functionality described herein, thus transforming a general-purpose processor into a specific-purpose processing environment to perform one or more of the operations described herein. In some embodiments, the processor circuitry may be embodied as a stand-alone integrated circuit or may be incorporated as one of several components on an integrated circuit. In some embodiments, the various components and circuitry of the node or other systems may be combined in a system-on-a-chip (SoC) architecture.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A system comprising:

an adaptive clock gate enable circuit to generate a clock gate enable signal having a logic value that changes in response to a change in an IP variable clock frequency;

a clock gate control logic circuit coupled to the adaptive clock gate enable circuit to generate an adaptive clock enable signal based at least in part on the clock gate enable signal; and an enable logic gate to generate a gated clock signal based at least in part on the adaptive clock enable signal and a clock signal, the gated clock signal to be received by an intellectual property (IP) circuit to selectively disable one or more IP circuit flip-flops.

2. The system of claim 1, wherein the clock gate control logic circuit includes:

a clock gate enable logic circuit to generate a clock enable signal; and a control logic gate coupled to the clock gate enable logic circuit, the control logic gate to generate the adaptive clock enable signal based at least in part on the clock gate enable signal and the clock enable signal.

3. The system of claim 2, further including a clock gate enable logic circuit coupled to the clock gate control logic circuit, wherein the clock gate enable logic circuit is to generate the clock enable signal.

4. The system of claim 3, wherein the clock gate enable logic circuit is to generate the clock enable signal based at least in part on a binary local clock state.

5. The system of claim 2, wherein the control logic gate includes an OR logic gate to:

receive the clock gate enable signal;

generate an inverted enable signal based at least in part on the clock gate enable signal;

receive the clock enable signal; and generate the adaptive clock enable signal, the adaptive clock enable signal including an adaptive clock logical ON value when either the inverted enable signal or the clock enable signal includes an IP logical high signal level.

6. The system of claim 1, wherein the enable logic gate includes an AND logic gate to:

receive the adaptive clock enable signal and the clock signal; and generate the gated clock signal, the gated clock signal including a gated clock logical ON value when both the adaptive clock enable signal and the clock signal include a gated clock logical high signal level.

7. The system of claim 1, further including a clock frequency control unit circuit, the adaptive clock gate enable circuit coupled to the clock frequency control unit circuit;

wherein the adaptive clock gate enable circuit is to generate the clock gate enable signal based at least in part on an IP variable clock frequency value.

8. The system of claim 7, wherein:

the clock frequency control unit circuit is configured to determine the IP variable clock frequency value transgresses a clock frequency threshold; and the adaptive clock gate enable circuit is to generate the clock gate enable signal in response to the IP variable clock frequency value transgressing the clock frequency threshold.

9. The system of claim 7, further including a clock gate synchronizer coupled to the clock gate control logic circuit, the clock gate synchronizer to synchronize the clock gate enable signal with the clock signal.

10. A method comprising:

generating a clock gate enable signal at an adaptive clock gate enable circuit, the clock gate enable signal having a logic value that changes in response to a change in an IP variable clock frequency;

generating an adaptive clock enable signal at clock gate control logic circuit coupled to the adaptive clock gate enable circuit based at least in part on the clock gate enable signal; and generating a gated clock signal at an enable logic gate based at least in part on the adaptive clock enable signal and a clock signal, the gated clock signal to be received by an intellectual property (IP) circuit to selectively disable one or more IP circuit flip-flops.

11. The method of claim 10, further including:

generating a clock enable signal at a clock gate enable logic circuit; and generating, at a control logic gate coupled to the clock gate enable logic circuit, the adaptive clock enable signal based at least in part on the clock gate enable signal and the clock enable signal.

12. The method of claim 11, wherein:

the clock gate control logic circuit includes a clock gate enable logic circuit; and the clock gate enable logic circuit is to generate the clock enable signal.

13. The method of claim 12, wherein the clock gate enable logic circuit is to generate the clock enable signal based at least in part on a binary local clock state.

14. The method of claim 11, wherein the control logic gate includes an OR logic gate to:

receive the clock gate enable signal;

generate an inverted enable signal based at least in part on the clock gate enable signal;

receive the clock enable signal; and generate the adaptive clock enable signal, the adaptive clock enable signal including an adaptive clock logical ON value when either the inverted enable signal or the clock enable signal includes an IP logical high signal level.

15. The method of claim 10, wherein the enable logic gate includes an AND logic gate to:

receive the adaptive clock enable signal and the clock signal; and generate the gated clock signal, the gated clock signal including a gated clock logical ON value when both the adaptive clock enable signal and the clock signal include a gated clock logical high signal level.

16. The method of claim 10, wherein:

the adaptive clock gate enable circuit is coupled to a clock frequency control unit circuit; and the adaptive clock gate enable circuit is to generate the clock gate enable signal based at least in part on an IP variable clock frequency value.

17. The method of claim 16, further including determining, at the clock frequency control unit circuit, the IP variable clock frequency value transgresses a clock frequency threshold;

wherein the adaptive clock gate enable circuit is to generate the clock gate enable signal in response to the IP variable clock frequency value transgressing the clock frequency threshold.

18. The method of claim 16, further including synchronizing, at a clock gate synchronizer coupled to the clock gate control logic circuit, the clock gate enable signal with the clock signal.

19. A system comprising:

a clock frequency control unit circuit to generate a clock gate enable signal based at least in part on an IP variable clock frequency value, the clock gate enable signal having a logic value that changes in response to a change in an IP variable clock frequency;

a clock gate control logic circuit coupled to the clock frequency control unit circuit, the clock gate control logic circuit to generate an adaptive clock enable signal based at least in part on the clock gate enable signal; and an enable logic gate coupled to the clock gate control logic circuit, the enable logic gate to generate a gated clock signal based at least in part on the adaptive clock enable signal, the gated clock signal to be received by an intellectual property (IP) circuit to selectively disable one or more IP circuit flip-flops.

20. The system of claim 19, further including:

an adaptive clock gate enable circuit coupled to the clock frequency control unit circuit, the adaptive clock gate enable circuit to generate the clock gate enable signal;

a clock gate control logic circuit coupled to the clock gate control logic circuit, the clock gate control logic circuit to generate a clock enable signal;

a control logic gate coupled to the clock gate control logic circuit, the control logic gate to generate an adaptive clock enable signal based at least in part on the clock gate enable signal and the clock enable signal; and an enable logic gate to generate the gated clock signal based at least in part on the adaptive clock enable signal and a clock signal.

21. The system of claim 20, wherein the gated clock signal received by the IP circuit causes a power consumption reduction by the IP circuit.

22. The system of claim 20, further including a clock gate enable logic circuit coupled to the clock gate control logic circuit, wherein the clock gate enable logic circuit is to generate the clock enable signal.

23. The system of claim 22, wherein the clock gate enable logic circuit is to generate the clock enable signal based at least in part on a binary local clock state.

24. The system of claim 20, wherein the control logic gate includes an OR logic gate to:

receive the clock gate enable signal;

generate an inverted enable signal based at least in part on the clock gate enable signal;

receive the clock enable signal; and generate the adaptive clock enable signal, the adaptive clock enable signal including an adaptive clock logical ON value when either the inverted enable signal or the clock enable signal includes an IP logical high signal level.

25. The system of claim 20, wherein the enable logic gate includes an AND logic gate to:

receive the adaptive clock enable signal and the clock signal; and generate the gated clock signal, the gated clock signal including a gated clock logical ON value when both the adaptive clock enable signal and the clock signal include a gated clock logical high signal level.

* * * * *